United States Patent [19]

Bosiers et al.

[11] Patent Number: 5,388,137
[45] Date of Patent: Feb. 7, 1995

[54] BURIED CHANNEL CHARGE COUPLED DEVICE

[75] Inventors: Jan T. J. Bosiers; Agnes C. M. Kleimann, both of Eindhoven, Netherlands

[73] Assignee: U.S. Philips Corporation, New York, N.Y.

[21] Appl. No.: 204,720

[22] Filed: Mar. 2, 1994

[30] Foreign Application Priority Data

Mar. 3, 1993 [EP] European Pat. Off. ............ 93200598

[51] Int. Cl.[6] ............... G11C 19/28; H01L 29/796
[52] U.S. Cl. ........................ 377/58; 257/221; 257/223; 257/246
[58] Field of Search ............. 257/219, 221–223, 257/229, 230, 246; 377/58

[56] References Cited

U.S. PATENT DOCUMENTS

| | | | |
|---|---|---|---|
| 3,931,465 | 1/1976 | Levine | 257/230 |
| 4,485,315 | 11/1984 | Collet et al. | 257/223 |
| 5,008,758 | 4/1991 | Burke | 257/222 |
| 5,115,458 | 5/1992 | Burkey et al. | 377/58 |
| 5,293,237 | 3/1994 | Yonemoto | 257/223 |
| 5,315,137 | 5/1994 | Asaumi et al. | 257/246 |

Primary Examiner—Gene M. Munson
Attorney, Agent, or Firm—Steven R. Biren

[57] ABSTRACT

It is known to bring the surface into the inverted state in CCD imaging devices with buried channels during the integration period in order to keep the dark current low (All Gates Pinning). The desired potential profile, with wells in which the charge is integrated bounded by potential beers, is obtained through the use of a two-phase structure with a doping profile in the channel or with a gate oxide having thickness differences. Owing to limiting conditions which hold for the clock voltages used for charge transport, serious limitations are imposed on the depth of the potential wells and thus also on the charge storage capacity of the pixels. This disadvantage is counteracted by the operation of the device not as a two-phase but, for example, as a four-phase CCD according to the invention, whereby a d.c. shift is present between the clock voltages for compensating the built-in, comparatively great potential differences described above. An imaging device is obtained thereby with a low dark current, a great charge storage capacity per pixel, and a high transport efficiency.

6 Claims, 3 Drawing Sheets

BURIED CHANNEL CHARGE COUPLED DEVICE

BACKGROUND OF THE INVENTION

The invention relates to a charge coupled device of the buried channel type with a semiconductor body comprising a first layer of a first conductivity type which adjoins a surface of the body and which forms a buried channel for storage and transport of electric charge, a second layer of the second conductivity type opposite to the first which lies below and adjoins the first layer and forms a barrier layer, and a third layer of the first conductivity type which lies below and adjoins the second layer and through which excess charge can be drained from the first layer, the surface being provided with a system of electrodes with a series of gates which are situated above the buried channel and which are connected to a voltage source for the at least temporary application of such a voltage to the gates that an inversion layer of the second conductivity type adjoining the surface is formed below the gates, while means are present for obtaining a built-in potential difference in the channel whereby potential wells in which charge can be stored alternating with potential barriers are formed in the channel upon the application of equal voltages to the gates. The invention also relates to a charge coupled image sensor comprising such a charge coupled device.

Such a device is known inter alia from U.S. Pat. No. 5,115,458. This describes an image sensor of the n-channel type comprising channels in the form of n-type surface zones provided in a p-type region (well) which is formed at the surface of an n-type substrate and which separates the channels from the substrate. It is known that in such a configuration any excess charge in the channels, consisting of electrons, can be drained off through the substrate. A major advantage of this vertical charge drain which can be mentioned is that it prevents the "blooming" effect which occurs upon overexposure. In addition, it is possible to set the charge state to zero at the beginning of an integration period (charge reset) in that all charge present in the image sensing elements is removed through the substrate, whereby it is possible, for example, to adjust the exposure time. The surface is provided with a system of electrodes comprising gate electrodes or gates which are insulated from the surface by a thin gate dielectric. Voltages are applied to the gates, at least during the integration period, such that inversion of the conductivity type occurs at the surface. This operating mode, also called "all gates pinning mode" (AGP), renders it possible to suppress to a substantial degree the dark current which is largely determined by the surface states, and thus in particular to eliminate largely the unpleasant influence of local defects which manifest themselves as white spots during display. In order to obtain sufficiently large charge packages per pixel also in the AGP mode, the known device is provided with means for optimizing the potential profile in the channel whereby, in the case of charge transport from left to right, a potential barrier and a potential well are formed below a portion of the gate adjoining the left-hand edge of each gate and the remaining portion of the gate, respectively. In the device described in the cited U.S. Pat. No. 5,115,458, these means are formed by a doping profile in the channel. Instead of this, other means known per se such as a profile in the thickness of the gate dielectric, or combinations of different means may be used. The device of U.S. Pat. No. 5,115,458 is operated as a two-phase device in the transport phase.

As will become evident from the description of the Figures, the present invention is based inter alia on the recognition that the two-phase operational mode leads to a limitation in the quantity of electric charge to be processed, and thus to a comparatively low signal-to-noise ratio. Since further details will be given below with reference to the drawings, a summary description only is given here of the effects which play a pan in the known device for an understanding of the invention. An n-type channel device is described here, but it will be perfectly obvious that an analogous description may be given for a p-type channel device.

In an n-type channel CCD, clock voltages are applied to the gates with a first, high level at which electric charge (electrons) is stored below the gates, and with a second, low level at which potential barriers are formed below the gates. Both the high and the low level are subject to stringent limitations; the high level must not be higher than the voltage at which punch-through takes place between the channel and the n-type substrate. At a higher gate voltage, charge can flow from the substrate into the channel; the low level is preferably not chosen to be lower than the threshold voltage so as to prevent inversion or at least deep inversion from occurring at the surface during transport. Such inversion in general leads to a reduction in the charge storage capacity and an increase in the parasitic gate capacitance, and thus to a possible delay during transport. These limitations of the clock voltages have consequences for the means by which the potential profile of wells and barriers is formed, i.e. the difference between well and barrier must remain so low that no potential barriers which hamper the charge transport are formed at the given clock voltage levels. This means in practice that the differences between potential wells and potential barriers become very small in the integration periods in which the entire integrating surface is in the inverted state, so that also the charge packages formed in the potential wells are very small. An increase in the size of the packages through an increase in the said potential difference is not possible owing to the problems during charge transport caused thereby and described above.

SUMMARY OF THE INVENTION

The invention has for its object inter alia to provide a charge coupled device in which the leakage currents are kept low in that the surface is brought into the inverted state, while at the same time comparatively much charge per charge storage element can be stored.

A charge coupled device according to the invention is characterized in that the said means are so situated in relation to the gates that, at the said equal voltages at the gates, potential wells are formed below gates of a first group and potential barriers are formed below gates of a second group electrically insulated from the gates of the first group, and in that clock voltages are applied to the gates for the transport of charge packages with a first level at which a potential well is formed in the channel and with a second level at which a potential barrier is formed in the channel, the first and/or the second levels of the clock voltages having such a d.c. difference that the built-in potential difference is at least partly compensated.

Since the potential barriers and the potential wells in a device according to the invention are not present below a common gate but below different gates, it is possible to influence the potentials in these regions by means of different voltages during transport. These voltages may be so chosen that the occurrence of potential barriers is prevented during charge transport practically independently of the built-in potential barrier. As will be indicated in the description of the Figures, this is achieved in principle by means of a favourably chosen offset between the voltages which are applied to the various gates.

An embodiment in which a maximum charge storage can be obtained is characterized in that at least the first level of the clock voltages applied to the gates of the second group compared with the first level of the clock voltages applied to the gates of the first group is higher in the case of an n-channel device and lower in the case of a p-channel device.

An embodiment in which a load on the clock voltage generators or buffers is obtained which is as uniform as possible is characterized in that the differences between the first and the second level of the clock voltages applied to the gates of the first group and to the gates of the second group are at least substantially equal to one another.

An important preferred embodiment is characterized in that the device is a four-phase device. Since the gates need not be clocked simultaneously in a four-phase CCD, which is often the case in two-phase devices, the clock synchronization is less critical, which again simplifies the control considerably.

A further embodiment of a charge coupled device according to the invention is characterized in that the means for obtaining potential wells and potential barriers below the gates of the first and second group of gates comprise a doping gradient in which the net concentration below the gates of the first group is higher than below the gates of the second group. In this connection a preferred embodiment in which a large charge storage capacity is obtained is characterized in that the difference in doping concentration is so chosen that, in the absence of electric charge, the potential difference between the channel potentials below a gate of the first group and a gate of the second group which are at equal voltage levels is at least approximately equal to half the potential difference between the maximum and the minimum channel potential, and preferably is almost equal to this latter potential difference.

BRIEF DESCRIPTION OF THE DRAWINGS

The invention will be explained in more detail with reference to an embodiment and the accompanying diagrammatic drawing in which.

DESCRIPTION OF THE PREFERRED EMBODIMENT

It is noted that the Figures are diagrammatic and not drawn to scale, and that in particular the dimensions in the thickness direction are shown on an enlarged scale in relation to the lateral dimensions.

Figure 1:
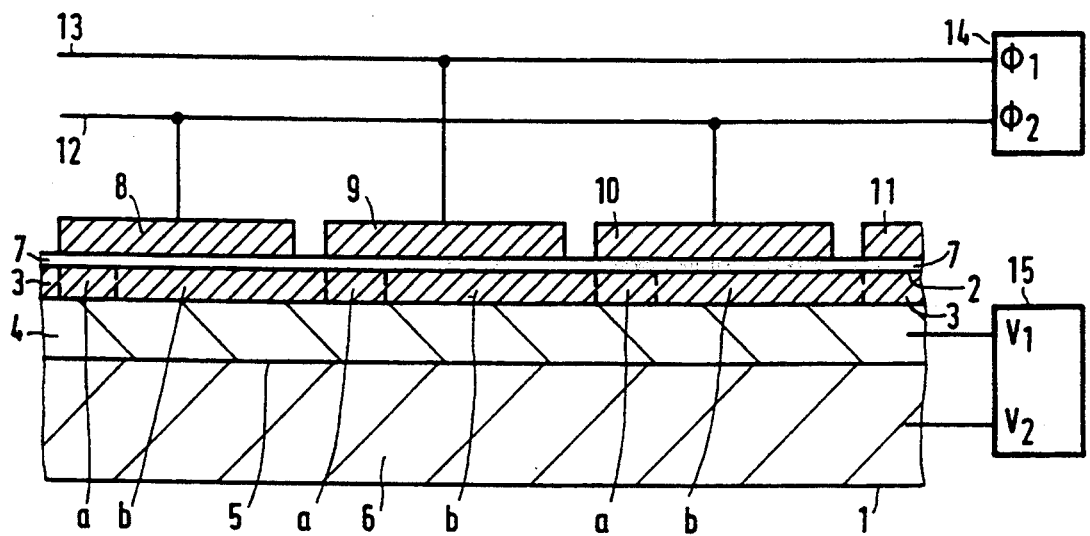
FIG. 1 is a cross-section of a known charge coupled device.
Figure 4:
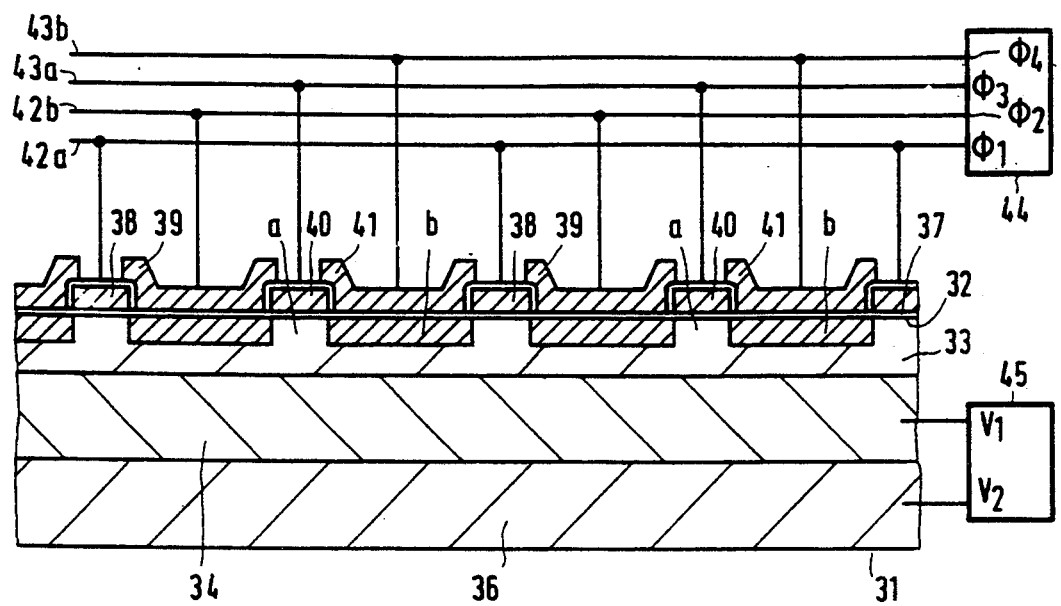
FIG. 4 is a cross-section of a charge coupled device according to the invention.

The device of FIG. 1 forms part of an image sensing device by which a radiation pattern projected on the upper side of the device can be converted into a pattern of charge packages, and comprises a silicon substrate 1 with an n-type layer 3 adjoining the surface 2 and forming the buried channel of the charge coupled device. The buried channel 3 adjoins the lower side at a thin p-type layer 4 which merges into a subjacent n-type region 6 via a pn junction 5. As is known, excess electrons, for example in the case of overexposure or a charge reset, can be removed through the substrate 6 in this configuration. The p-type layer 4 forms a barrier layer between the substrate 6 and the buried channel layer 3 and is so formed that on the one hand there is a sufficient electric insulation between the substrate and the buried channel layer 3, while on the other hand a sufficiently low barrier is obtained between the substrate and the buried channel for draining off excess charge. The surface 2 is covered with a gate dielectric 7 which is formed, for example, by a layer of silicon oxide. Gate electrodes in the form of strips of conductive material are provided on the oxide layer 7. Only four of these gate electrodes, of which the number is high in practical cases, for example a few hundred, are shown in FIG. 4, i.e. the gates 8 to 11. The gates are alternately connected to one of the clock lines 12 and 13 for the supply of clock voltages to the gates.

Figure 2:
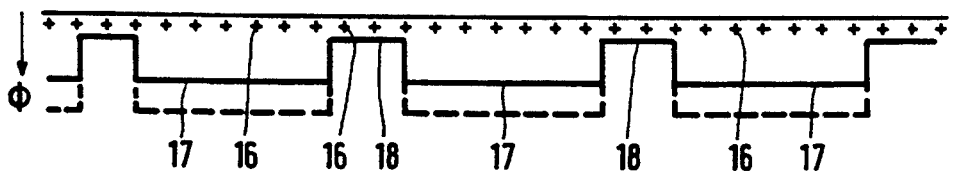
FIG. 2 shows a potential profile in this device during an integration period.

A doping profile is provided in the layer 3 such that the net doping concentration in the regions a below the left-hand edge of the gates is lower than below the remaining portions of the gates. The separation between the more highly doped portions and the more weakly doped portions is shown with a broken line in the Figure. As is known, such a doping results in a potential profile in the buried channel with equal voltages at the gates, i.e. barriers in or below the more weakly doped regions a and potential wells in or below the more highly doped regions b. The gates 8–11 are connected to a clock voltage source 14 via the clock lines 12 and 13, which source supplies two-phase clock voltages $\phi_1$ and $\phi_2$. The p-type barrier layer 4 and the n-type substrate 6 are connected to a voltage source 15 which supplies the voltages $V_1$ and $V_2$ to the layer 3 and the substrate 6, respectively and which is depicted only diagrammatically. The clock voltages $\phi_1$ and $\phi_2$, or at least the voltage which is supplied to the gates during the integration period, are so chosen that the entire or at least substantially the entire surface is in inversion during the integration period, i.e. that a layer of holes is formed below the gates. This situation is shown in FIG. 2 in which the potential $\Phi$ (positive potential plotted in downward direction) is shown on the vertical axis and the location in the channel on the horizontal axis. The inversion layer is symbolized by the + signs 16. The surface potential $\Phi$ is the same over at least substantially the entire surface owing to the inversion layer 16 and at a certain voltage which is determined inter alia by the voltage $V_1$ and by the threshold voltage. Deeper down in the channel, at some distance from the surface, a potential $\Phi$ is obtained with potential wells 17 below the more highly doped regions b and with potential barriers 18 below the more weakly doped regions a. The charge carriers generated, in this case electrons, collect in the potential wells 17. The quantity of charge which can be stored per charge package determines the shades of grey to be distinguished, and thus the sharpness of the picture. The maximum quantity of charge is determined by the depth of the potential wells 17. When a potential well becomes full owing to local overexposure, excess charge can be drained off to the substrate 6 through the p-type layer 4, for which purpose the voltage $V_1$ is so chosen that the potential barrier across the p-type layer 4 is slightly lower than the potential beer 18.

Figure 3:
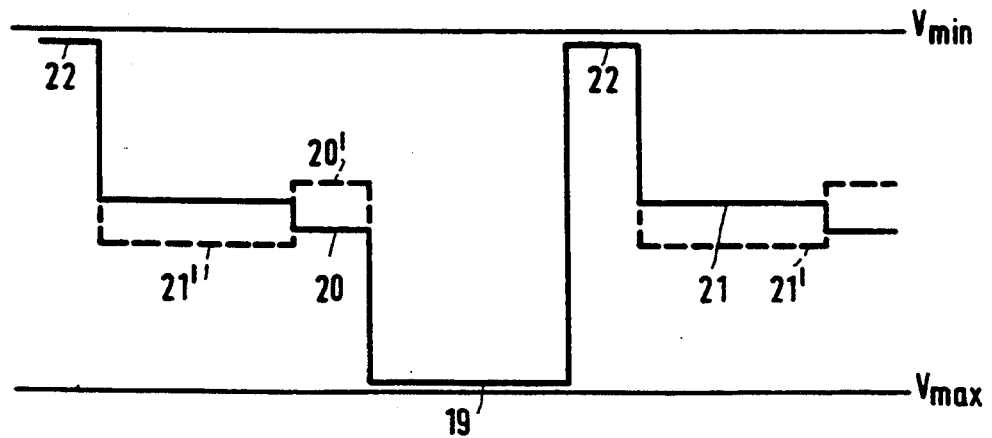
FIG. 3 shows a potential profile in this device during charge transport.

FIG. 3 shows a corresponding potential profile during the two-phase charge transport. The clock voltages $\phi_1$ and $\phi_2$ during transport are so chosen that no or at least no deep inversion at the surface occurs with a view to a good charge transport. Owing to the absence of the inversion layer 16, potential wells 19 and potential barriers 20 are formed in the channel in the absence of charge at a high voltage $\phi_1$, and a potential well 21 and a barrier 22 at a low voltage $\phi_2$, while the difference between the potentials 19 and 20 and the difference between the potentials 21 and 22 may be substantially greater than that between the potentials 17 and 18 in the integration period. The potentials vary between a minimum value $V_{min}$ and a maximum value $V_{max}$. The value $V_{min}$ is determined by the threshold value. If the gate voltage were lower, inversion would occur at the surface, which is not desired in view of an efficient charge transport. The value $V_{max}$ corresponds to the maximum voltage which can be applied to the gates. At an even higher voltage, the potential barrier between the channel and the substrate is so reduced that injection of charge carriers from the substrate into the channel takes place.

To obtain stronger signals adapted to the potential wells 19 it would be necessary to make the potential wells 17 (FIG. 2) deeper, for example, by increasing the difference in doping concentration between the regions a and b (FIG. 1). A result of this would be, however, that the distance between the potential levels 19 and 20 (see FIG. 3) also becomes greater. The levels 20' and 21' are indicated in FIG. 3 with broken lines, which levels would replace the potentials 20 and 21, respectively, at such a doping concentration. At a too great difference in doping between the regions a and b, the level 21' remains below the level 20. This means that during charge transport, when electrons are to be transferred from the potential well 21' to the potential well 19, a portion of the charge cannot be transferred owing to the barrier 20'. Reducing the barrier 20' by a higher gate voltage is not possible because the potential level 19 would become lower than $V_{max}$ and charge would flow from the substrate 6 into the potential well 19. An increase of the level 21' to above the level 20' through a reduction in the voltage applied to the overlying gate has the disadvantage that the level 22 will exceed $V_{min}$, whereby inversion will occur locally at the surface.

Summarizing, it can be stated that the known charge coupled device, in which the surface leakage current is suppressed by means of an inversion layer at the surface during the integration period, has the disadvantage that the maximum charge storage per pixel is very small, at least much smaller than in imaging devices without the said leakage current suppression.

FIG. 4 shows in cross-section a charge coupled device in which the disadvantage mentioned above is counteracted to an important degree while the said leakage current suppression is maintained. The device comprises a semiconductor body 31 of silicon, comparable to the semiconductor body 1 in FIG. 1, with a first n-type layer 33 adjoining the surface 32 and forming the buried channel, a subjacent second p-type layer 34 forming a barrier layer, and an adjoining third layer or substrate 36 of the n-type through which charge can be drained off from the buried channel. Above the channel 33 and separated therefrom by the interposed gate oxide layer 37, an electrode system is provided with a series of gate electrodes or gates 38, 39, 40 and 41. The gates are connected to a clock voltage source 44 through the clock lines 42 and 43. The voltages supplied by the source 44 are such, similar to the device in FIG. 1, that an inversion layer is induced below the gates at least temporarily, for example during the integration period of an imaging device, at the given voltage $V_1$ which is applied to the p-type layer 34 by the source 45. To obtain sufficiently deep potential wells during integration, means are provided, formed by a doping profile in the channel again in the present example, whereby a potential pattern of wells separated by barriers is induced in the buried channel at equal voltages at the gates 38–41. In FIG. 4, the portions of the channel 33 having a comparatively low doping concentration are referenced a and the portions having a comparatively strong doping concentration are referenced b.

According to the invention, the portions a and b are not provided two-by-two below a common gate, but are so situated relative to the gates that potential wells are formed below the gates 39 and 41 and potential barriers below the gates 38 and 40 at the said equal voltages at the gates, the gates 39/41 being electrically insulated from the gates 38/40. Clock voltages having at least two levels, a high or first level at which a potential well is formed in the channel and a low or second level at which a potential barrier is formed in the channel, are applied to the gates 38 to 41. According to the invention, the clock voltages are not the same, but the first and/or the second levels of the clock voltages have such a d.c. difference that the built-in potential difference is at least partly compensated. As will be explained below with reference to the clock diagram of FIG. 5, the clock voltages are such that at least the first or high level of the clock voltages at the gates 38 and 40 is higher than the high level of the clock voltages applied to the gates 39 and 41. Obviously, the difference between the clock voltages is reversed in the case of a p-channel device.

In the present embodiment, the device forms a four-phase CCD in which the gates 38 are connected to the clock voltage source 44 through the clock line 42a, the gates 39 through the clock line 42b, the gates 40 through the clock line 43a, and the gates 41 through the clock line 43b, the source supplying the clock voltages $\phi_1$, $\phi_2$, $\phi_3$, and $\phi_4$ to the gates 38, 39, 40 and 41, respectively.

The gates in this embodiment are provided in a two-layer wiring, for example, two layers of polycrystalline silicon or poly for short, mutually separated by an interposed oxide layer or a layer of some other suitable dielectric material. The regions a and b may be formed in a self-aligned manner relative to the gates in that the exposed surface between the gates 38 and 40 is subjected to a doping step for locally increasing the concentration so as to obtain the zones 12 after the definition of the gates 38 and 40 in the first poly layer, after which the gates 39 and 41 are formed from a second poly layer above the zones b.

In a specific embodiment, the CCD channel 33 is formed by an implanted n-type layer with a thickness of approximately 1.0 μm and a total doping of approximately $0.9 \times 10^{12}$ atoms.cm$^{-2}$. The regions b are obtained by an additional implantation with a dose of approximately $8.0 \times 10^{12}$ atoms.cm$^{-2}$ which corresponds to a potential difference of approximately 7 V in the burled channel for a gate voltage at which no inversion occurs, and to a potential difference of approximately 3 V for a gate voltage at which inversion does occur below the gates, such as during the integration period.

Figure 6:
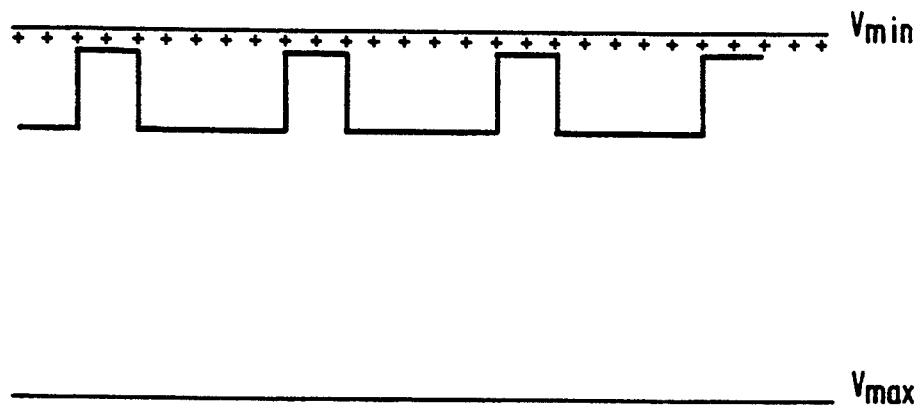
FIG. 6 shows a potential profile in this device during an integration period.

A voltage $V_2$ of, for example, 20 V is applied to the substrate 36 during operation, which voltage may be temporarily increased to, for example, 35 V for the purpose of charge reset in the channel, if so desired, in which case all charge is removed from the channel. The voltage $V_1$ applied to the p-type barrier layer 34, and through this layer also to the usual p-type surface zones which bound the channel laterally, is for example 5 V. When a voltage of, for example, −5 V is applied to the gates 38-41 at a highest threshold voltage of approximately 9 V, i.e. at the areas of the more strongly doped regions b, the entire surface below the gates is in the inverted state, as is diagrammatically depicted in FIG. 6 with the + signs. In this Figure, in which the potential in the burled channel is drawn during the integration time, $V_{inv}$ represents the surface potential pinned by the inversion. The potential in the channel exhibits wells, corresponding to the more strongly doped regions b, and barriers, corresponding to the more weakly doped regions a. The difference between the wells and the barriers is approximately 3 V, which is approximately 50% more than in the situation described above where the device is operated as a two-phase CCD.

Figure 5:
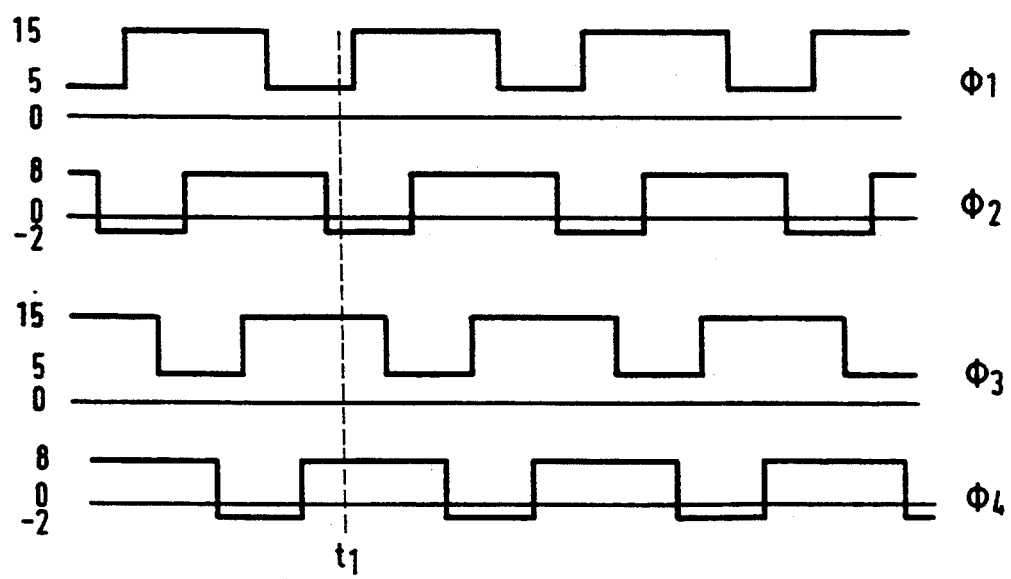
FIG. 5 is a diagram of the clock voltages applied to the gates of this device during charge transport.
Figure 7:
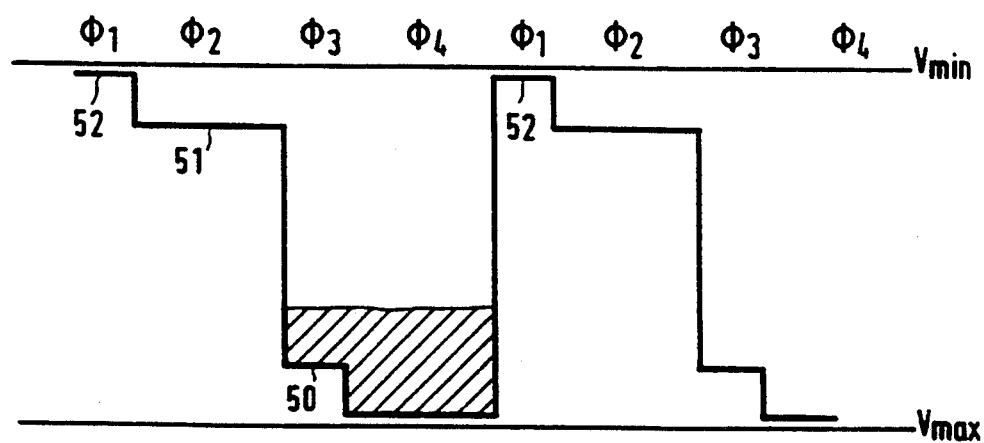
FIG. 7 shows a potential profile in this device during charge transport.

The clock voltages shown in FIG. 5 are applied to the gates during transport, $\phi_1$ and $\phi_3$ being applied to the gates 38 and 40, respectively (transfer gates), and $\phi_2$ and $\phi_4$ to the gates 39 and 41, respectively (storage gates). The clock voltages $\phi_1$ and $\phi_3$ vary between 5 and 15 V; the clock voltages $\phi_2$ and $\phi_4$ vary between −2 and 8 V. This means that, given the same amplitudes, there is a voltage difference between the clock voltages which is substantially equal to, but opposed to the potential difference in the channel caused by the doping difference, so that the potential differences in the channel obtained by the doping profile for the purpose of charge integration in the integration time are at least substantially eliminated during the transport phase. FIG. 7 shows the potential distribution in the channel which obtains with the clock voltages at a moment $t_1$ when $\phi_1$ and $\phi_2$ have the low voltage levels of 5 and −2 V, respectively, and $\phi_3$ and $\phi_4$ are at the high voltage levels of 15 and 8 V, respectively. The hatched region in this Figure represents a charge package. The level 51 lies close to $V_{min}$, without inversion taking place at $\phi_1$, which would be the case in a two-phase CCD. The potential level 50 lies comparatively close to $V_{max}$, which would also be impossible in a two-phase CCD. It is achieved by this, as is shown in the Figure, that the potential 50 corresponding to 15 V of $\phi_3$ is lower than the level 51 corresponding to −2 V of $\phi_2$, so that potential barriers which hamper an efficient transport are avoided.

The transport further proceeds in a manner usual for a conventional four-phase CCD, $\phi_1$ first becoming high (15 V) from moment $t_1$, so that the potential 52 shifts to the level of the potential 50. Then $\phi_3$ jumps to the low voltage (5 V) and forms a barrier with the value of the level 52. Then $\phi_2$ goes to 8 V, so that a potential well, into which a portion of the charge flows, is formed below $\phi_2$. The rest of the charge is transported when at a next moment $\phi_4$ drops from 8 V to −2 V. The transport efficiency may have a high value usual for a buffed channel CCD since potential barriers caused by the great difference in doping between the regions a and b are prevented by the difference in clock voltages between the gates 38/40 and the gates 39/41 during transport. Owing to the substantial difference in doping, it is possible to increase the charge storage capacity per pixel during the integration time while the surface is in inversion, so that the leakage currents can be kept low.

It will be apparent that the invention is not limited to the embodiment described here, but that many more variations are possible to those skilled in the art. Thus the high level of $\phi_1$ may be chosen to be lower in order to prevent barriers during transport. It is also possible to use alternative known techniques, possibly in combination, for obtaining the desired potential profile in the integration time instead of the doping profile a, b. Thus, for example, a gate oxide 37 having different thicknesses defining the potential barriers and potential wells 17 and 18 may be used, possibly in combination with a doping profile in the channel. Although particular advantages are obtained by the four-phase operating mode described here, the device may be operated in an alternative known manner during transport, for example, in a five-phase or a six-phase mode. In addition, electric charge may be removed from the transport channel (charge reset) in the device described here before or during the integration period in that a positive voltage pulse is applied to the substrate. If the charge is to be removed locally only, means may be provided by which the charge removal is selective such as, for example, described in European Patent Application 92203825.2, corresponding to U.S. patent application Ser. No. 08/164,233, filed Dec. 8, 1993, the contents of which are deemed to be incorporated in the present Application by reference.

We claim:

1. A charge coupled device of the buried channel type with a semiconductor body comprising a first layer of a first conductivity type which adjoins a surface of the body and which forms a buried channel for storage and transport of electric charge, a second layer of the second conductivity type opposite to the first which lies below and adjoins the first layer and forms a barrier layer, and a third layer of the first conductivity type which lies below and adjoins the second layer and through which excess charge can be drained from the first layer, the surface being provided with a system of electrodes with a series of gates which are situated above the buried channel and which are connected to a voltage source for the at least temporary application of such a voltage to the gates that an inversion layer of the second conductivity type adjoining the surface is formed below the gates, and means being provided for obtaining a built-in potential difference in the channel whereby potential wells in which charge can be stored alternating with potential barriers are formed in the channel upon the application of equal voltages to the gates, characterized in that said means are so situated in relation to the gates that, at said equal voltages at the gates, potential wells are formed below gates of a first group and potential barriers are formed below gates of a second group electrically insulated from the gates of the first group, and in that clock voltages are applied to the gates for the transport of charge packages with a first level at which a potential well is formed in the channel and with a second level at which a potential barrier is formed in the channel, at least one of the first and the second levels of the clock voltages having such a d.c. difference that the built-in potential difference is at least partly compensated.

2. A charge coupled device as claimed in claim 1, characterized in that at least the first level of the clock voltages applied to the gates of the second group compared with the first level of the clock voltages applied to the gates of the first group is higher in the case of an n-channel device and lower in the case of a p-channel device.

3. A charge coupled device as claimed in claim 1, characterized in that the differences between the first and the second level of the clock voltages applied to the gates of the first group and to the gates of the second group are at least substantially equal to one another.

4. A charge coupled device as claimed in claim 1, characterized in that the device is a four-phase device.

5. A charge coupled device as claimed in claim 1, characterized in that the means for obtaining potential wells and potential barriers below the gates of the first and second group of gates comprise a doping gradient in which the net concentration below the gates of the first group is higher than below the gates of the second group.

6. A charge coupled device as claimed in claim 5, characterized in that the difference in doping concentration is so chosen that, in the absence of electric charge, the potential difference between the channel potentials below a gate of the first group and a gate of the second group which are at equal voltage levels is at least approximately equal to half the potential difference between the maximum and the minimum channel potential.

* * * * *